United States Patent
Sakurai et al.

(10) Patent No.: US 6,633,334 B1
(45) Date of Patent: Oct. 14, 2003

(54) SOLID-STATE IMAGE PICKUP DEVICE WITH OPTIMUM LAYOUT OF BUILDING COMPONENTS AROUND A PHOTOELECTRIC CONVERSION PORTION

(75) Inventors: Katsuhito Sakurai, Machida (JP); Shigetoshi Sugawa, Atsugi (JP); Isami Ueno, Hadano (JP); Katsuhisa Ogawa, Machida (JP); Toru Koizumi, Yokohama (JP); Tetsunobu Kochi, Hiratsuka (JP); Hiroki Hiyama, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/215,195

(22) Filed: Dec. 18, 1998

(30) Foreign Application Priority Data

Dec. 26, 1997 (JP) ............................................. 9-361084

(51) Int. Cl.[7] ...................... H04N 5/335; H01L 31/062; H01L 31/113
(52) U.S. Cl. ..................... 348/308; 348/294; 348/302; 257/292
(58) Field of Search ................................ 348/301, 302, 348/304, 308, 222.1, 294; 257/292, 291, 225, 226, 231; 250/208.1; 438/57; 327/515

(56) References Cited

U.S. PATENT DOCUMENTS

| | | | |
|---|---|---|---|
| 4,835,404 A | 5/1989 | Sugawa et al. | 250/578 |
| 4,879,470 A | 11/1989 | Sugawa et al. | 250/578 |
| 4,967,067 A | 10/1990 | Hashimoto et al. | 250/208.1 |
| 4,972,243 A | 11/1990 | Sugawa et al. | 357/30 |
| 5,162,912 A | 11/1992 | Ueno et al. | 358/213.16 |
| 5,184,006 A | 2/1993 | Ueno | 250/208.1 |
| RE34,309 E | 7/1993 | Tanaka et al. | 358/213.31 |
| 5,262,870 A | 11/1993 | Nakamura et al. | 358/212 |
| 5,539,196 A | 7/1996 | Miyawaki et al. | 250/208.1 |
| 5,693,932 A | 12/1997 | Ueno et al. | 250/208.1 |
| 5,714,752 A | 2/1998 | Ueno et al. | 250/208.1 |
| 5,955,753 A | 9/1999 | Takahashi | 257/292 |
| 6,094,220 A * | 7/2000 | Nakano et al. | 348/223.1 |
| 6,160,281 A * | 12/2000 | Guidash | 257/292 |
| 6,352,869 B1 * | 3/2002 | Guidash | 438/16 |
| 6,423,994 B1 * | 7/2002 | Guidash | 257/292 |

FOREIGN PATENT DOCUMENTS

| | | |
|---|---|---|
| EP | 0862219 A2 | 9/1998 |
| JP | 09-46596 | 2/1997 |

OTHER PUBLICATIONS

Iida et al., "A ¼–Inch 330k Square Pixel Progressive Scan CMOS Active Pixel Image Sensor", IEEE Journal of Solid–State Circuits, vol. 32, No. 11, 11/97.

S.K. Mendis, "CMOS Active Pixel Image Sensors for Highly Integrated Imaging Systems", IEE Jouranl of Solid–State Circuits, vol. 32, No. 2, 2/97.

(List continued on next page.)

Primary Examiner—Wendy R. Garber
Assistant Examiner—Justin Misleh
(74) Attorney, Agent, or Firm—Fitzpatrick Cella Harper & Scinto

(57) ABSTRACT

To optimize the layout of a pixel portion, there is provided a solid-state image pickup device including a photoelectric conversion portion, a charge transfer portion for transferring signal charges generated in the photoelectric conversion portion, and an amplifier portion for amplifying a signal corresponding to the signal charges transferred from the charge transfer portion and outputting the signal, wherein a plurality of photoelectric conversion portions, a plurality of charge transfer portions, and a plurality of amplifier portions are arranged in the row or/and column directions, and the charge transfer portion and the amplifier portion which are closest to each other are connected.

5 Claims, 12 Drawing Sheets

OTHER PUBLICATIONS

H. Takahashi, "Solid State Image Pickup Device and Image Pickup System", Patent abstracts of Japan No. 09–046596, 2/97.

Sunetra K. Mendis, CMOS Active Pixel Image Sensors for Highly Integrated Imaging Systems, Feb. 1997, IEEE Journal of Solid–State Circuits, vol. 32 No. 2, 187–197.*

S.K. Mendis, et al., "CMOS Active Pixel Image Sensors for Highly Integrated Imaging Systems", IEEE Journal of Solid State Circuits, vol. 32 (1997), No. 2 (Feb.).

* cited by examiner

SOLID-STATE IMAGE PICKUP DEVICE WITH OPTIMUM LAYOUT OF BUILDING COMPONENTS AROUND A PHOTOELECTRIC CONVERSION PORTION

BACKGROUND OF THE INVENTION

1. Field of the Invention

The present invention relates to a solid-state image pickup device and an image pickup system using the same and, more particularly, to a solid-state image pickup device having a plurality of photoelectric conversion portions arrayed in the row and column directions, a charge transfer means for transferring signal charges generated in the photoelectric conversion portions, and an amplifier means for amplifying a signal corresponding to the signal charges transferred by the charge transfer means and outputting the signal.

2. Related Background Art

There are conventional solid-state image pickup devices which use photodiodes as photoelectric conversion portions and move photocarriers stored in the photodiodes using a FET or CCD. These solid-state image pickup devices are used for various apparatuses such as solar cells, image cameras, copying machines, and facsimile apparatuses and also improving in their conversion efficiency and integration density.

A device of FET moving scheme is known as a MOS solid-state image pickup device. For example, a solid-state image pickup device called a CMOS sensor is disclosed in Japanese Laid-Open Patent Application No. 09-46596. The arrangement will be briefly described below.

FIG. 1 is an explanatory view showing a pixel arrangement corresponding to one pixel of a CMOS sensor disclosed in FIG. 8 of Japanese Laid-Open Patent Application No. 09-46596.

As shown in FIG. 1, one pixel has a photodiode portion PD, a transfer switch MS11 for transferring signal charges from the photodiode portion PD, an amplifier means MS14 for amplifying the transferred signal and outputting it, a selection switch MS13 for selecting the pixel, and a reset switch MS12 for clearing the remaining signal charges and resetting them to a potential VR. Signals φTX, φRES, and φSEL are used to control the transfer switch MS11, reset switch MS12, and selection switch MS13, respectively.

For the above solid-state image pickup device, an optimum layout of building members (transfer switch, amplifier means, selection switch, and reset switch) of a pixel is not disclosed. According to the study by the present inventors, in certain arrangements of pixel building members or interconnections, crosstalk from the signal φRES or φSEL poses a problem, the fill factor lowers due to interconnections, or the sensitivity lowers due to an increased capacitance in the presence of interconnections.

SUMMARY OF THE INVENTION

It is an object of the present invention to provide an optimum layout of building components around a photoelectric conversion portion.

In order to achieve the above object, according to an aspect of the present invention, there is provided a solid-state image pickup device comprising a photoelectric conversion portion, charge transfer means for transferring signal charges generated in the photoelectric conversion portion, and amplifier means for amplifying a signal corresponding to the signal charges transferred from the charge transfer means and outputting the signal, wherein a plurality of photoelectric conversion portions, a plurality of charge transfer means, and a plurality of amplifier means are arranged in row or/and column directions, and the charge transfer means and the amplifier means which are closest to each other are connected.

According to another aspect of the present invention, there is provided a solid-state image pickup device wherein a plurality of photoelectric conversion portions are arranged in row and column directions, and charge transfer means for transferring signal charges generated in the photoelectric conversion portions are arranged in the row and column directions in correspondence with the photoelectric conversion portions, and reset means for resetting the charge transfer means or the charge transfer means and the photoelectric conversion portions corresponding to the charge transfer means are arranged on one side of an array direction of the charge transfer means, and amplifier means for amplifying a signal corresponding to the signal charges transferred from the charge transfer means are arranged on the other side of the array direction of the charge transfer means.

According to still another aspect of the present invention, there is provided a solid-state image pickup device wherein a plurality of photoelectric conversion portions are arranged in row and column directions, and charge transfer means for transferring signal charges generated in the photoelectric conversion portions and reset means for resetting the charge transfer means or the charge transfer means and the photoelectric conversion portions are arranged in one of the row and column directions around the photoelectric conversion portions, and amplifier means for amplifying a signal corresponding to the signal charges transferred from one photoelectric conversion portion and outputting the signal is arranged in the other direction different from the one direction of the one photoelectric conversion portion around which the charge transfer means and the reset means are arranged or in the other direction around another photoelectric conversion portion in a diagonal direction, the amplifier means being arranged on a side closest to the one photoelectric conversion portion.

According to still another aspect of the present invention, there is provided an image pickup system comprising a solid-state image pickup device including a photoelectric conversion portion, charge transfer means for transferring signal charges generated in the photoelectric conversion portion, and amplifier means for amplifying a signal corresponding to the signal charges transferred from the charge transfer means and outputting the signal, wherein a plurality of photoelectric conversion portions, a plurality of charge transfer means, and a plurality of amplifier means are arranged in row or/and column directions, and the charge transfer means and the amplifier means which are closest to each other are connected, and a signal processing circuit for processing the signal output from the solid-state image pickup device.

With the above arrangement, a high fill factor and high sensitivity can be obtained.

Other objects, features, and advantages of the invention will be apparent from the following specification and accompanying drawings.

DESCRIPTION OF THE PREFERRED EMBODIMENTS

The embodiments of the present invention will be described below. Before the description, the technical backgrounds of the present invention will be described.

As the arrangement of one pixel of an solid-state image pickup device, an arrangement having a photodiode portion (PD), a transfer switch (TX), a floating diffusion (FD), a reset switch (RES), a reset power source (VR), a selection switch (SEL), an amplifier means (SF), an output portion (OUT), and a VDD power source (VDD) will be described.

In this solid-state image pickup device, to increase the area of the photodiode portions (PD) for storing charges after photoelectric conversion in the arrayed pixels, building members other than the photodiode portions (PD) must be mounted around the photodiode portions (PD) at high density. To increase the fill factor of the pixels, preferably the number of contacts is decreased and all pixels have equal diffusion regions.

Figure 2:
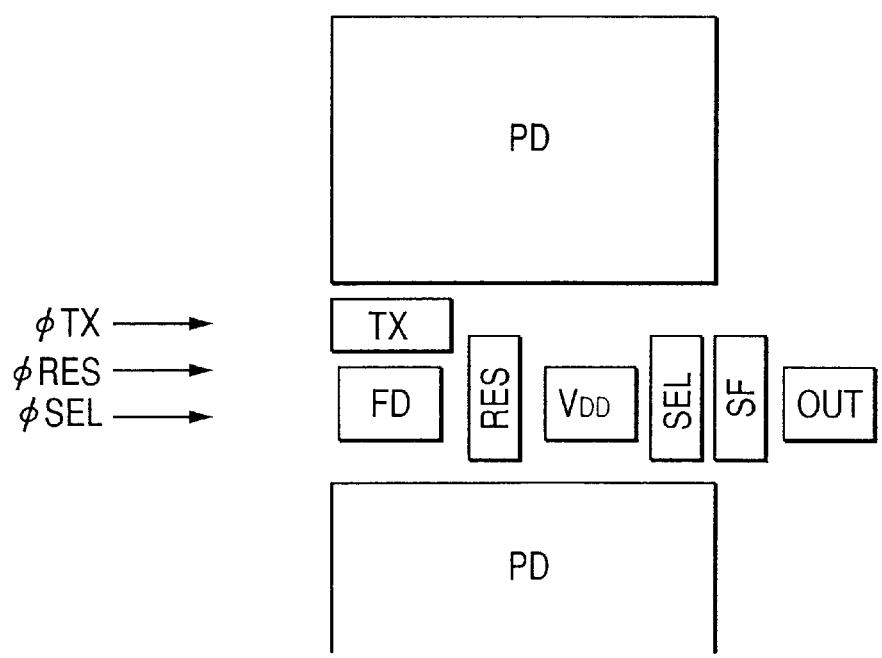
FIG. 2 is a view showing a schematic layout of a solid-state image pickup device.

From the above viewpoint, when a VDD power source is used as a reset power source, an arrangement shown in FIG. 2 is preferably used. If the reset power source (VR) is arranged independently of the VDD power source, an arrangement shown in FIG. 3 is preferably used.

Figure 3:
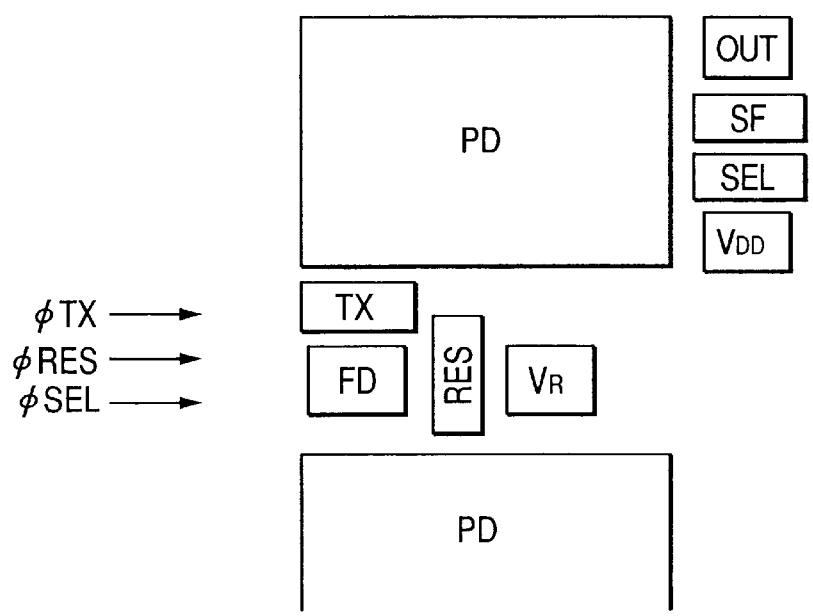
FIG. 3 is a view showing another schematic layout of a solid-state image pickup device.

However, when the floating diffusion FD and the gate of the amplifier means (SF) are connected, the arrangement shown in FIG. 2 or 3 has the following disadvantages.

(1) In the arrangement shown in FIG. 2 or 3, the control line of a signal φTX for controlling the transfer switch (TX), the control line of a signal φRES for controlling the reset switch (RES), and the control line of a signal φSEL for controlling the selection switch (SEL) extend in the horizontal direction (column direction) between adjacent photodiode portions PD.

To connect the floating diffusion (FD) and the gate of the amplifier means (SF) without increasing the interval between the photodiode portions PD where the control lines extend, the floating diffusion and the gate of the amplifier means are connected by a multilayered interconnection running above the gate of the reset switch (RES) or the gate of the selection switch (SEL).

In this case, however, crosstalk from the signal φRES or φSEL to the floating diffusion (FD) poses a problem.

(2) When an interconnection is to be formed while avoiding the gate of the reset switch RES or selection switch SEL, it must be formed on the photodiode portions PD, which lowers the fill factor.

(3) If the interconnection between the floating diffusion (FD) and the gate of the amplifier means (SF) is long, the FD capacitance increases to lower the sensitivity.

The present invention has been made as a result of extensive studies and examinations by the present inventors to solve the above problem while maintaining the arrangement shown in FIG. 2 or 3.

The embodiments of the present invention will be described below.

Throughout the drawings to be described below, suffices added to PD, TX, SEL, OUT, RES, SF, and FD indicate not members for transferring, outputting, and resetting signals from one photodiode portion PD but members arranged around one photodiode portion PD which will be normally recognized to be one pixel.

Figure 5:
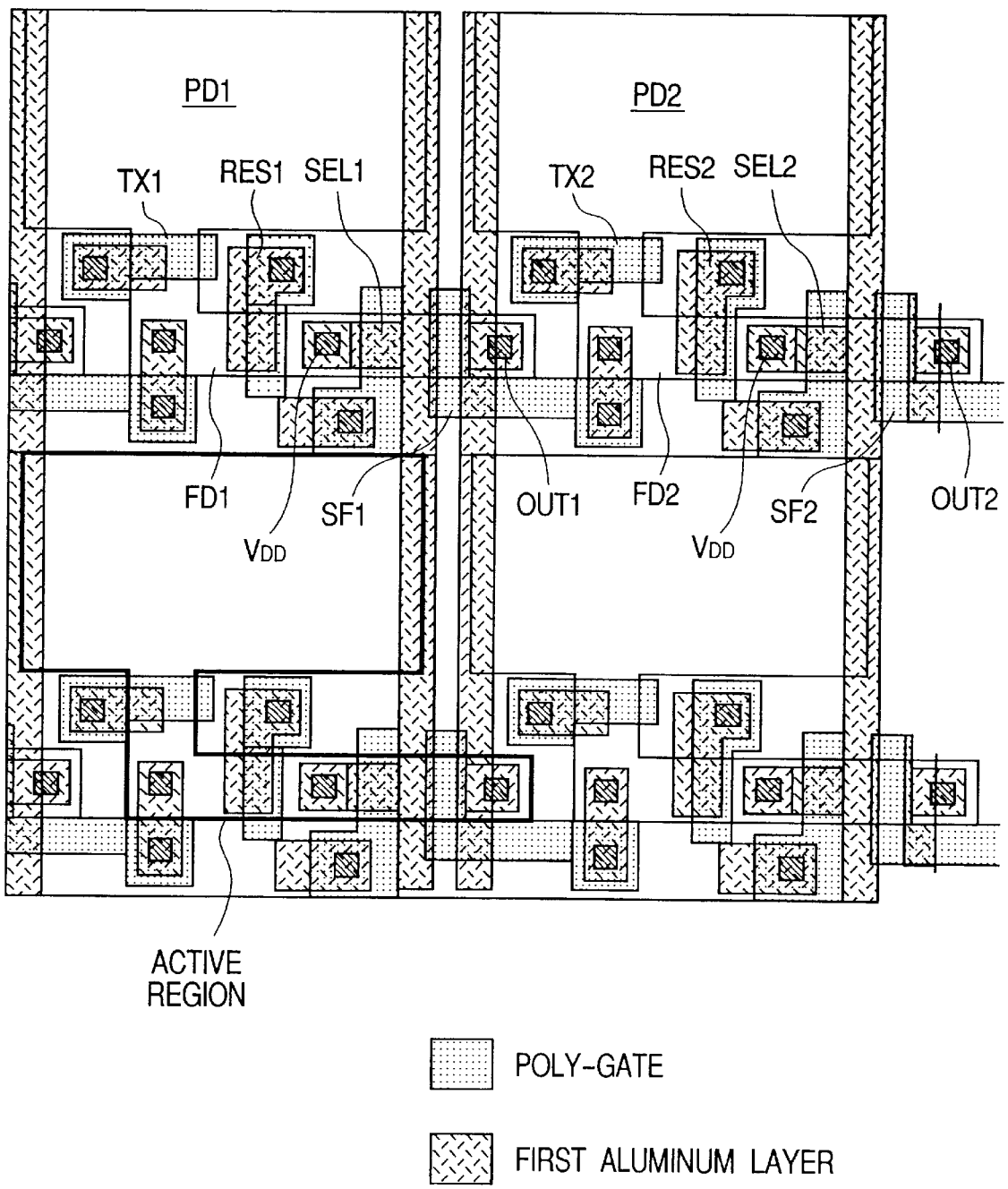
FIG. 5 is a view showing a specific layout of the solid-state image pickup device according to the first embodiment.
Figure 6:
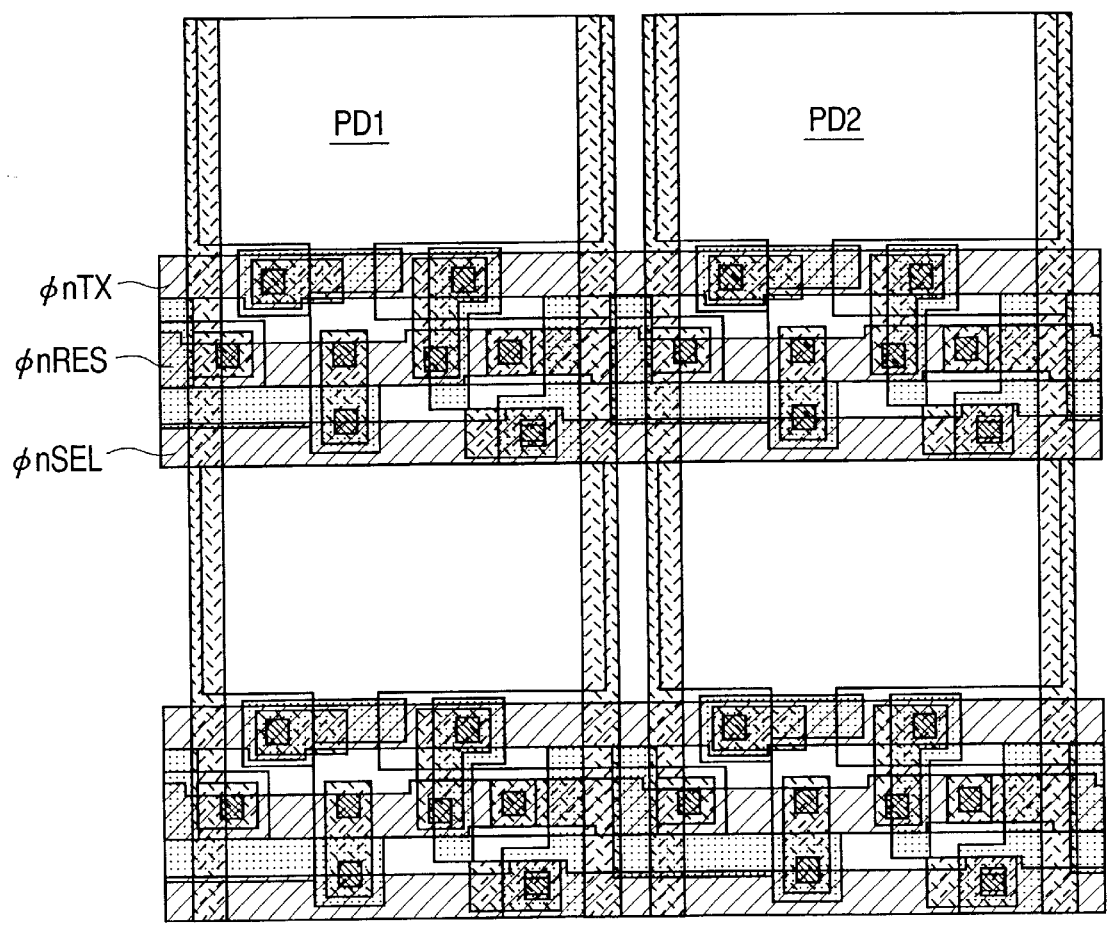
FIG. 6 is a view showing the specific layout of the solid-state image pickup device according to the first embodiment.
Figure 9:
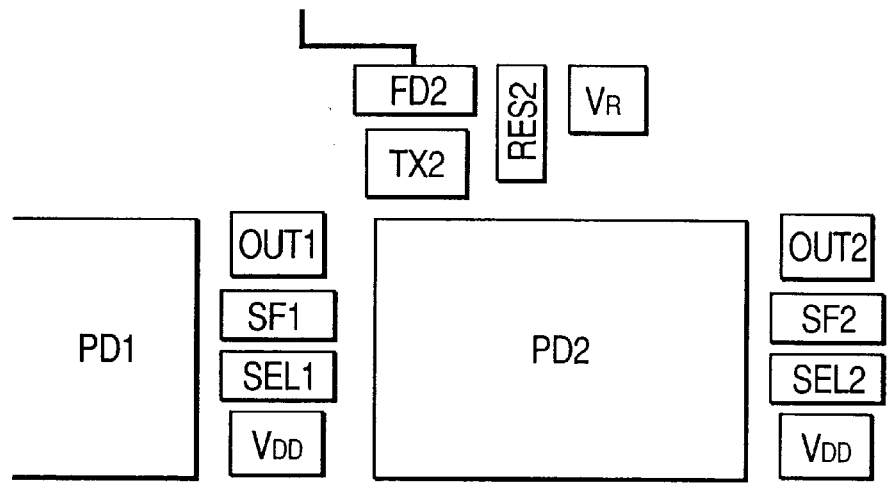
FIG. 9 is a view showing another modification of the schematic layout of the solid-state image pickup device according to the second embodiment.
Figure 10:
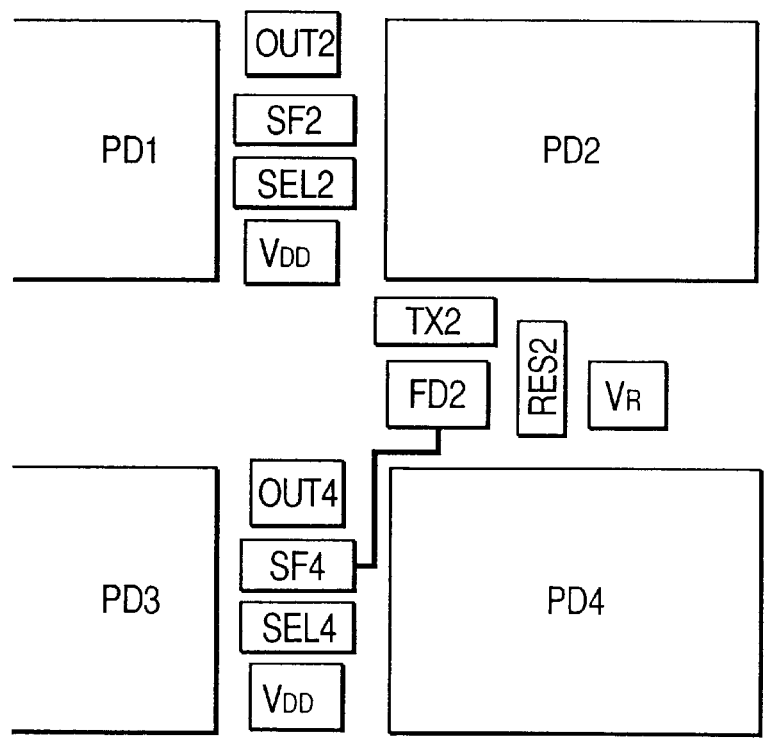
FIG. 10 is a view showing still another modification of the schematic layout of the solid-state image pickup device according to the second embodiment.

The layout of a sensor of this type is shown in, e.g., FIGS. 6 and 9 (CMOS sensor using a photogate) or FIG. 10 (CMOS sensor using a photodiode) in "CMOS Active Pixel Image Sensors for Highly Integrated Imaging Systems", IEEE Journal of Solid-State Circuits, Vol. 32, No. 2, February 1997, pp. 187–197. One pixel of a sensor of this type normally has an almost rectangular shape or a shape similar to a rectangle, and pixel building members including a transfer switch TX and a reset switch RES are located around the photoelectric conversion portion such as a photodiode portion PD. Hence, in the present invention, an arrangement having a photodiode portion PD2, a transfer switch TX2, a floating diffusion FD2, a reset switch RES2, a selection switch SEL2, an amplifier means SF2, and an output portion OUT2, as shown in FIGS. 4, 5, 7, or 12 etc., may be regarded as one pixel, so a signal may be output from the pixel having the photodiode portion PD2 using an amplifier means SF1 or SF3 of another pixel.

Figure 4:
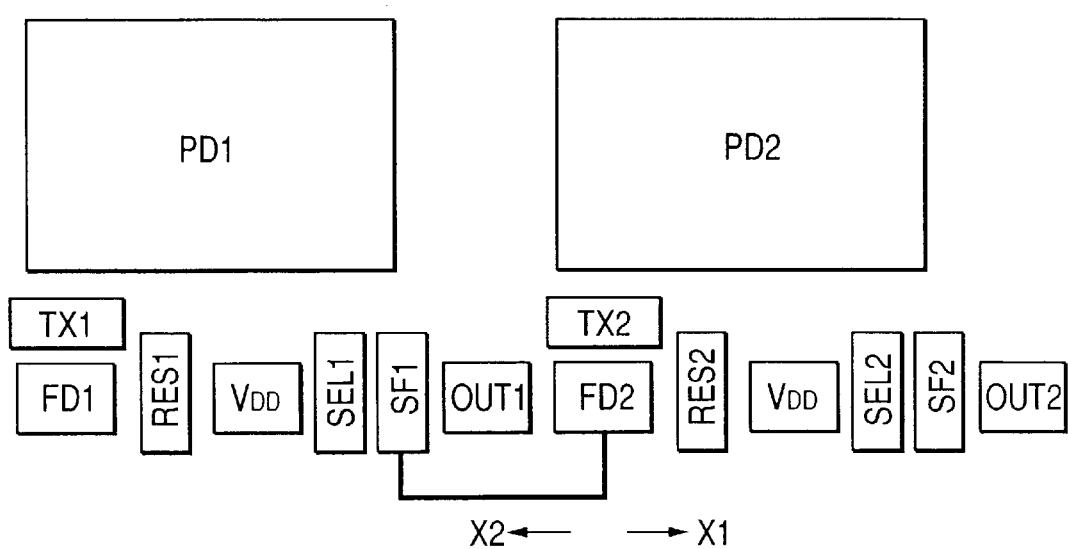
FIG. 4 is a view showing a schematic layout of a solid-state image pickup device according to the first embodiment.

FIG. 4 is a view showing a schematic layout of the first embodiment of the present invention. This embodiment corresponds to the arrangement shown in FIG. 2 which uses a VDD power source as a reset power source. In this embodiment, as shown in FIG. 4, to read out a signal from the photodiode portion PD2 using an amplifier means SF1 and an output portion OUT1 on the adjacent photodiode portion PD1 side, the floating diffusion FD2 around the photodiode portion PD2 is connected to the amplifier means SF1 on the photodiode portion PD1 side.

In this arrangement, the interconnection is shorter than that when the floating diffusion FD2 and the gate of the amplifier means SF2 are connected, and the interconnection does not run above the gate of the reset switch RES2 or the gate of the selection switch SEL2. Consequently, problems (1) to (3) above can be solved.

FIGS. 5 and 6 are views showing the schematic layout shown in FIG. 4 more specifically. FIG. 5 shows a layout without a second aluminum layer as an upper interconnection. FIG. 6 shows a layout including a second aluminum layer as an upper interconnection. FIGS. 5 and 6 show only four pixels. Only a signal read from the photodiode portion PD2 will be described below, and this also applies to the remaining photodiode portions.

As shown in FIG. 5, the transfer switch TX2, floating diffusion FD2, reset switch RES2, selection switch SEL2, amplifier means SF2, and output portion OUT2 surround around the photodiode portion PD2. A VDD power source which also serves as a reset power source is interposed between the reset switch RES2 and the selection switch SEL2. A region indicated by a bold line in FIG. 5 is an active region.

In this embodiment, the signal from the photodiode portion PD2 is output not through the amplifier means SF2 and output portion OUT2 but through the amplifier means SF1 and output portion OUT1 arranged on the side of the photodiode portion PD1 arrayed on the same row. For this purpose, the floating diffusion FD2 on the photodiode portion PD2 side and the amplifier means SF1 on the photodiode portion PD1 side are connected using a polysilicon layer and a first aluminum layer. The amplifier means SF1 and output portion OUT1 are formed in the same active region as that of the photodiode portion PD1.

According to this embodiment, the interconnection between the floating diffusion FD and the amplifier means SF shortens, and the interconnection is not formed above the gate of the reset switch RES or the gate of the selection switch SEL. In addition, in this embodiment, the interconnection between the floating diffusion FD2 and the amplifier means SF1 runs between the control line of a signal φnSEL and the control line of a signal φnRES to prevent the output signal from being influenced by the signal φnSEL or φnRES, as shown in FIG. 6.

Figure 7:
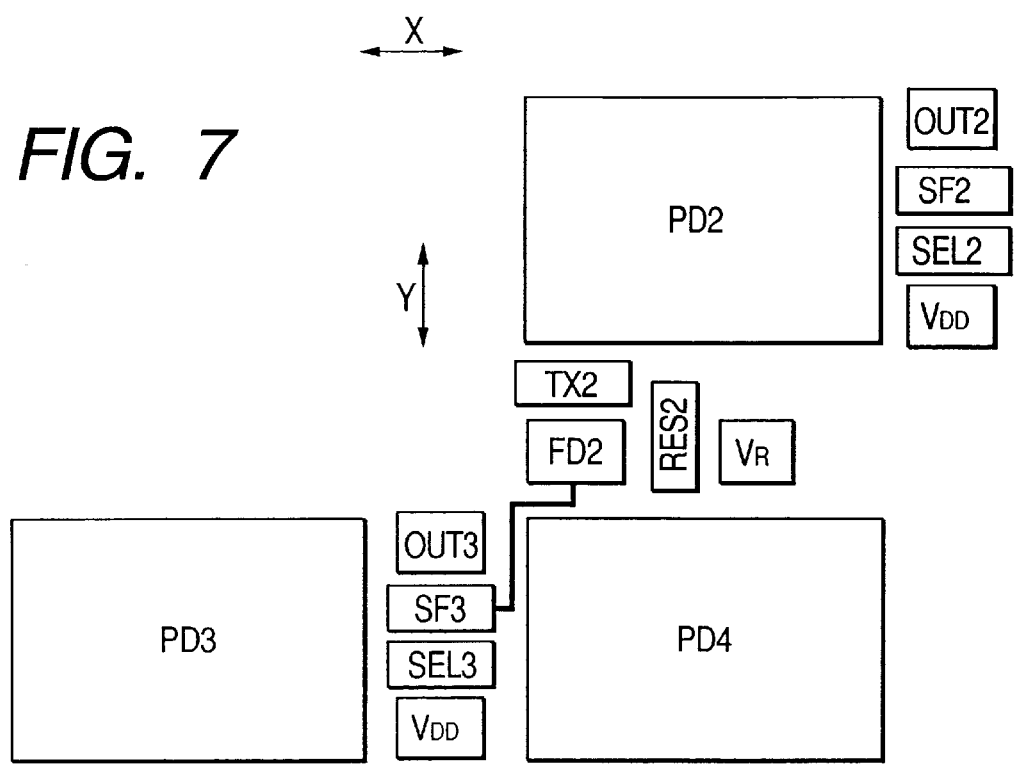
FIG. 7 is a view showing a schematic layout of a solid-state image pickup device according to the second embodiment.

FIG. 7 is a view showing a schematic layout of the second embodiment of the present invention. This embodiment corresponds to the arrangement shown in FIG. 3 having a reset power source independently of a VDD power source. As shown in FIG. 7, in this embodiment, to output a signal from a photodiode portion PD2 using an amplifier means (SF3) and output portion (OUT3) surrounding a photodiode portion PD3 in the diagonal direction, a floating diffusion FD2 around the photodiode portion PD2 is connected to the amplifier means SF3 around the photodiode portion PD3.

In this arrangement, the interconnection shortens and does not run above the gate of a reset switch RES2, so problems (1) to (3) above can be solved, as in the first embodiment.

In addition, according to this embodiment, even when the interconnection is formed on the control line of a signal φSEL using a multilayered interconnection, no crosstalk is generated. More specifically, in this embodiment, even when the control line of the signal φSEL for controlling a selection switch (SEL) extends above the floating diffusion FD2, the control line is connected to not the selection switch SEL3 but the selection switch SEL2 on the next, upper row (a select pulse signal is not applied to the selection switch SEL2), so no crosstalk is generated.

Various modifications as will described below can be made for the second embodiment.

Figure 8:
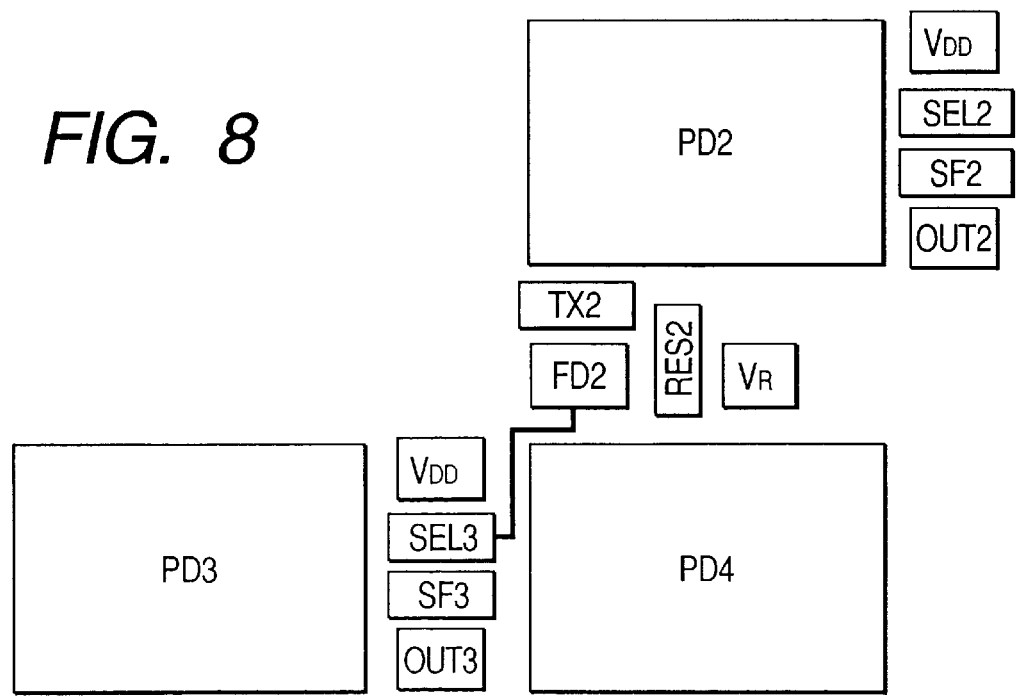
FIG. 8 is a view showing a modification of the schematic layout of the solid-state image pickup device according to the second embodiment.

(I) As shown in FIG. 8, the amplifier means SF and selection switch SEL are reversed.

(II) As shown in FIG. 9, the transfer switch TX2, floating diffusion FD2, reset switch RES2, and reset power source VR are mounted on the upper side of the photodiode portion PD2, and the floating diffusion FD2 is connected to the amplifier means SF (not shown) on the upper row.

(III) As shown in FIG. 10, the selection switch SEL, output portion OUT, VDD power source VDD, and amplifier means SF are located on the left side of the photodiode portion PD.

Figure 11:
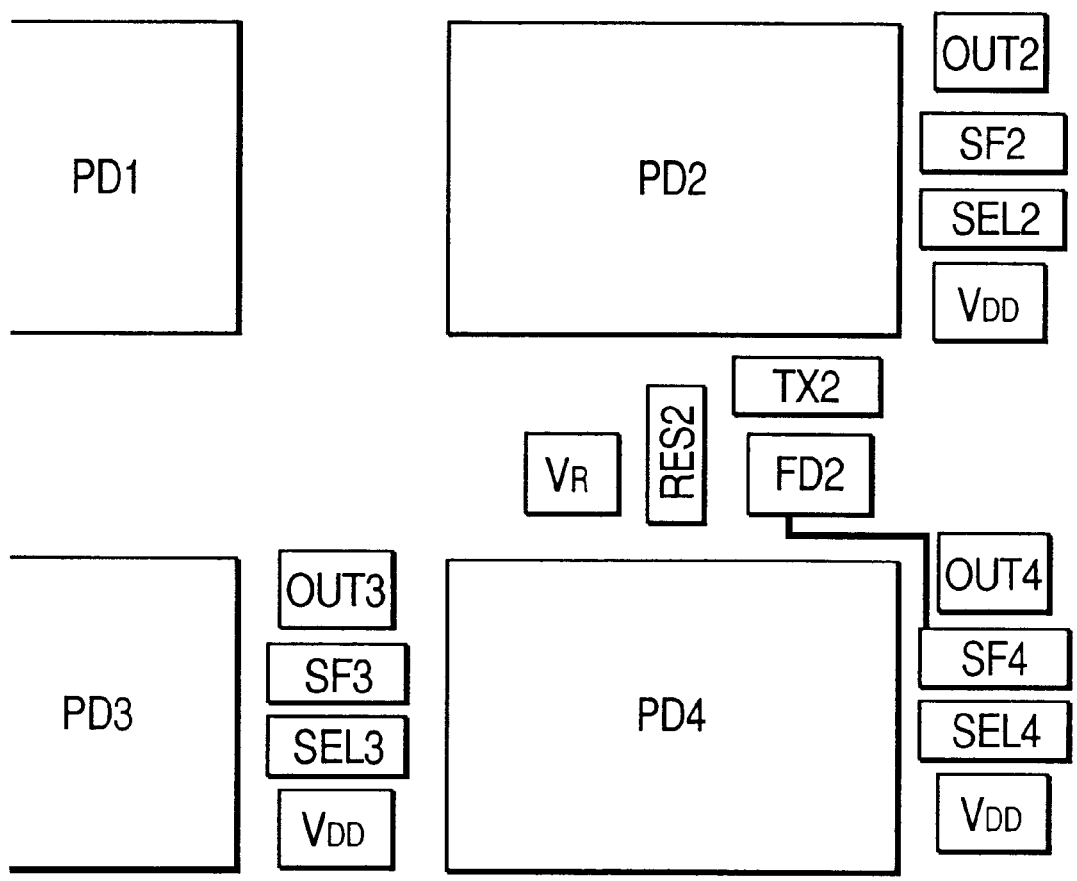
FIG. 11 is a view showing still another odification of the schematic layout of the solid-state mage pickup device according to the second embodiment.

(IV) As shown in FIG. 11, the floating diffusion FD is located on the right side of the drawing, the arrangement of the transfer switch TX, floating diffusion FD, reset switch RES, and reset power source VR is reversed to that in FIG. 7, and the floating diffusion FD is connected to the photodiode portion PD on the lower side.

In the above-described drawings, the photodiode portion PD has a rectangular shape. However, the photodiode portion PD need not always have this shape and can have any shape as far as the shape allows to maximize the amount of charges to be stored.

Figure 12:
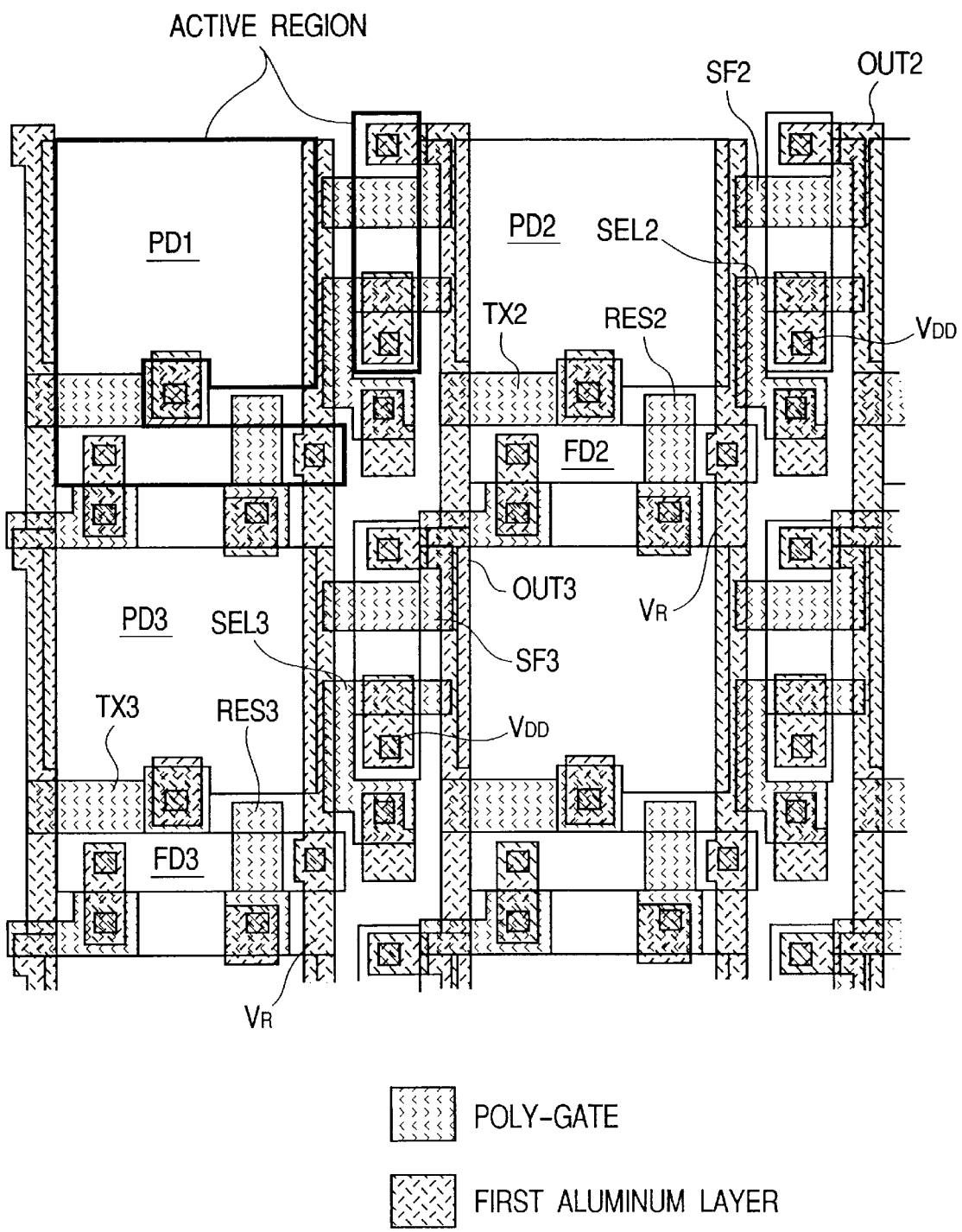
FIG. 12 is a view showing a specific layout of the solid-state image pickup device according to the second embodiment.
Figure 13:
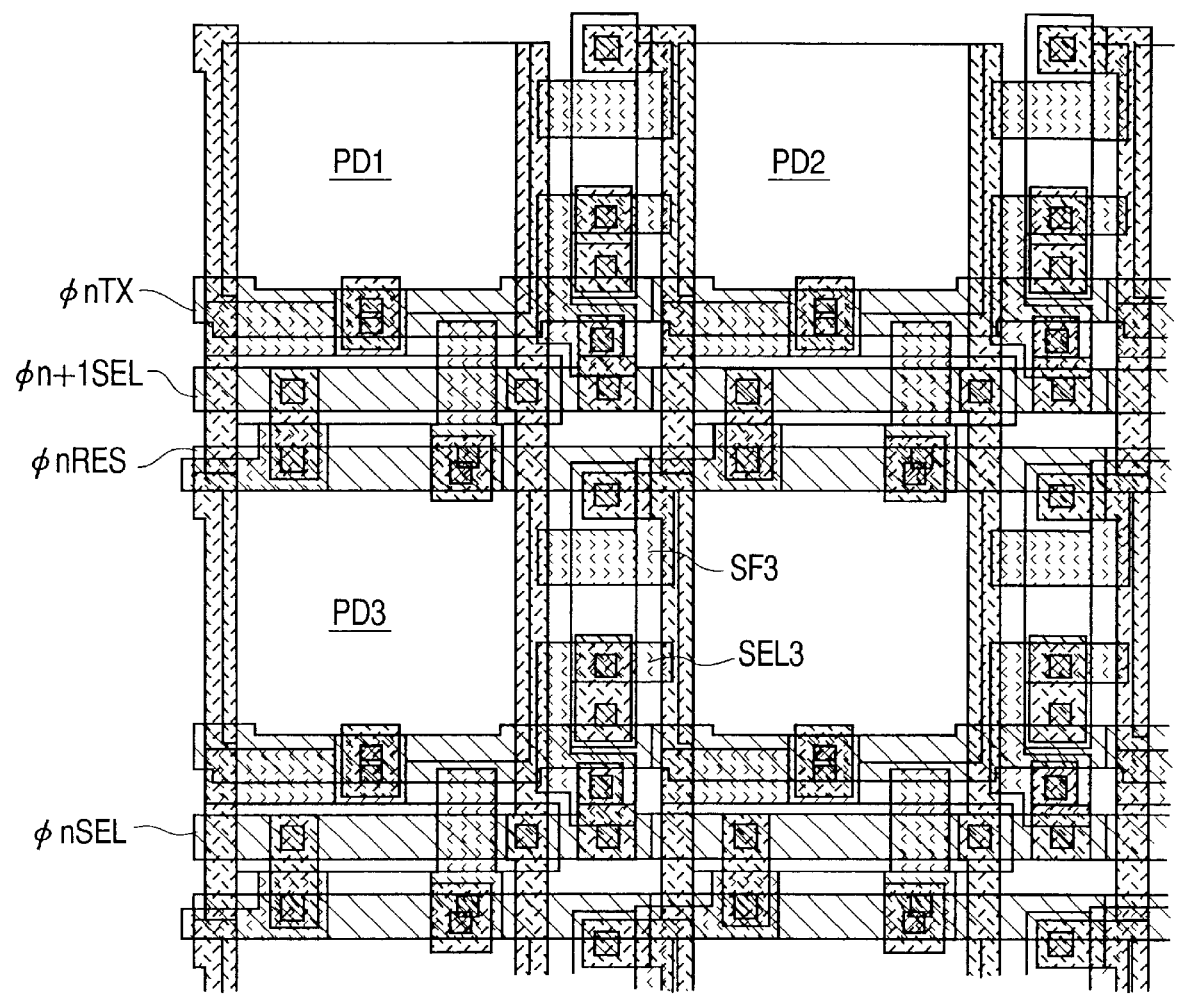
FIG. 13 is a view showing the specific layout of the solid-state image pickup device according to the second embodiment.

FIGS. 12 and 13 are views showing the layout in FIG. 7 more specifically. FIG. 12 shows a layout without a second aluminum layer as an upper interconnection. FIG. 13 shows a layout including a second aluminum layer as an upper interconnection. FIGS. 12 and 13 show only four pixels. Only a signal read from the photodiode portion PD2 will be described below, and this also applies to the remaining photodiode portions.

As shown in FIG. 12, the transfer switch TX2, floating diffusion FD2, reset switch RES2, selection switch SEL2, amplifier means SF2, and output portion OUT2 are arranged around the photodiode portion PD2. A reset power source Vr and VDD power source are mounted adjacent to the reset switch RES2 and selection switch SEL2. Two regions indicated by bold lines in FIG. 12 are active regions.

In this embodiment, the signal from the photodiode portion PD2 is output not through the amplifier means SF2 and output portion OUT2 but through the amplifier means SF3 and output portion OUT3 surrounding the photodiode portion PD3 in the diagonal direction. For this purpose, the floating diffusion FD2 around the photodiode portion PD2 and the amplifier means SF3 around the photodiode portion PD3 are connected using a polysilicon layer and a first aluminum layer.

According to this embodiment, the interconnection between the floating diffusion FD and the amplifier means SF shortens, and the interconnection does not run above the gate of the reset switch RES or the gate of the selection switch SEL.

In this embodiment, the gate of the selection switch SEL3 is connected to the control line of the signal φnSEL. For this reason, even when the control line of a signal φn+1SEL extends above the floating diffusion FD2, the problem of crosstalk is not posed.

Figure 14:
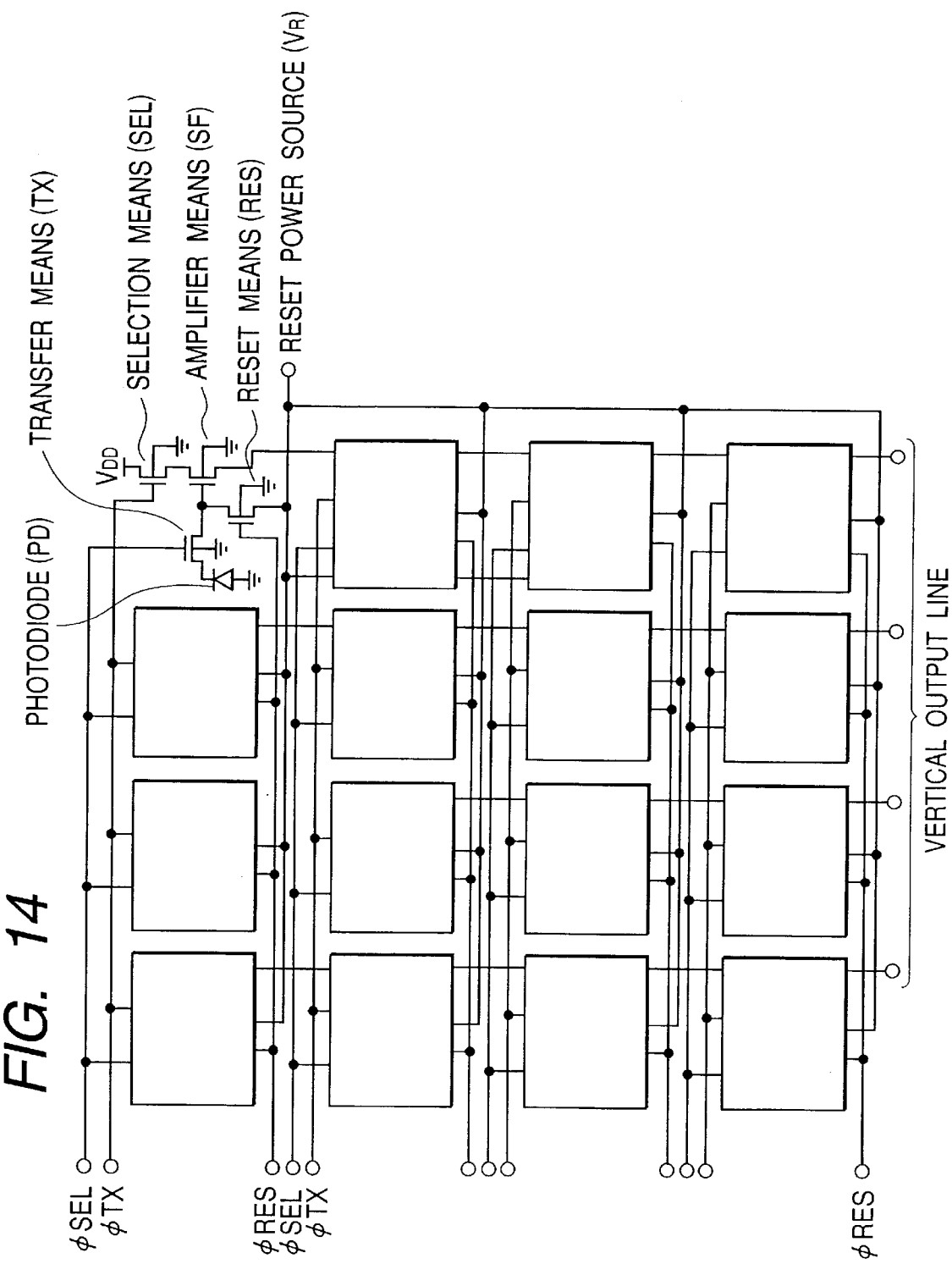
FIG. 14 is a view showing the circuit arrangement of a pixel portion of the solid-state image pickup devices of the first and second embodiments.

FIG. 14 is a view showing the circuit arrangement of a pixel portion of the solid-state image pickup devices of the first and second embodiments.

Figure 1:
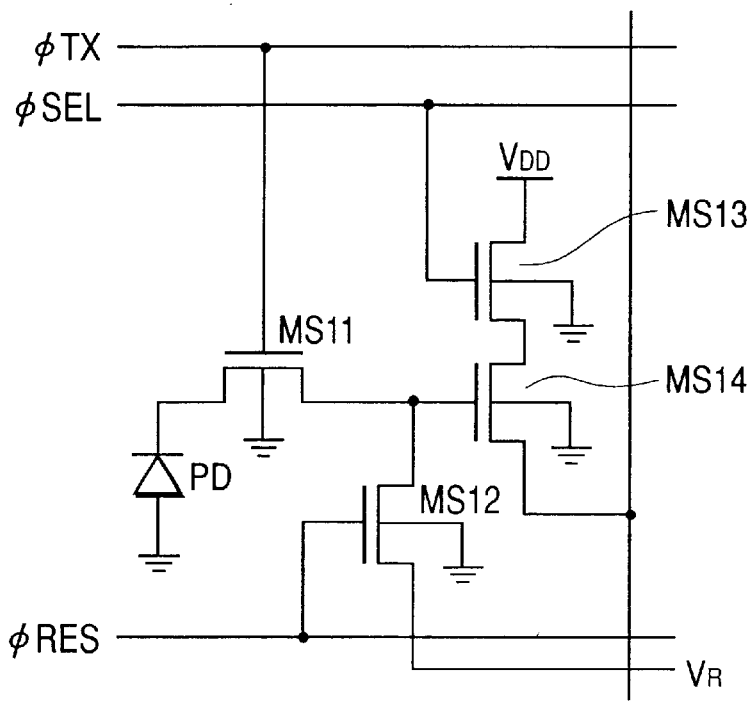
FIG. 1 is a view showing one pixel of a solid-state image pickup device.

FIG. 14 shows a 4×4 pixel arrangement, and one pixel has the same arrangement as that shown in FIG. 1.

The present invention is not limited to the pixel arrangement shown in FIG. 1. As the third embodiment, a selection means may be connected between an amplifier means and an output portion, as shown in FIG. 15.

Figure 15:
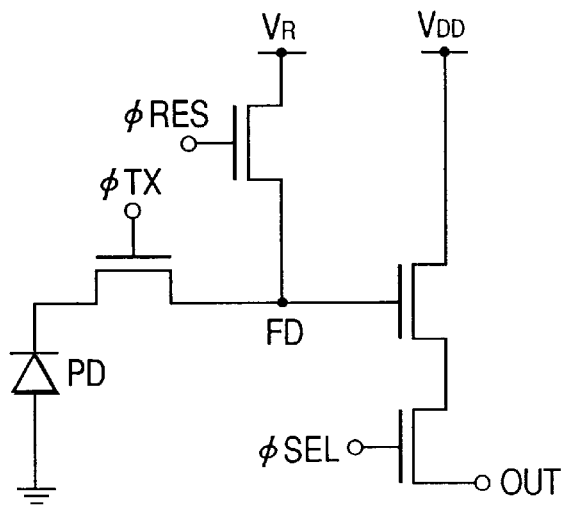
FIG. 15 is a view showing another pixel of the solid-state image pickup device.
Figure 16:
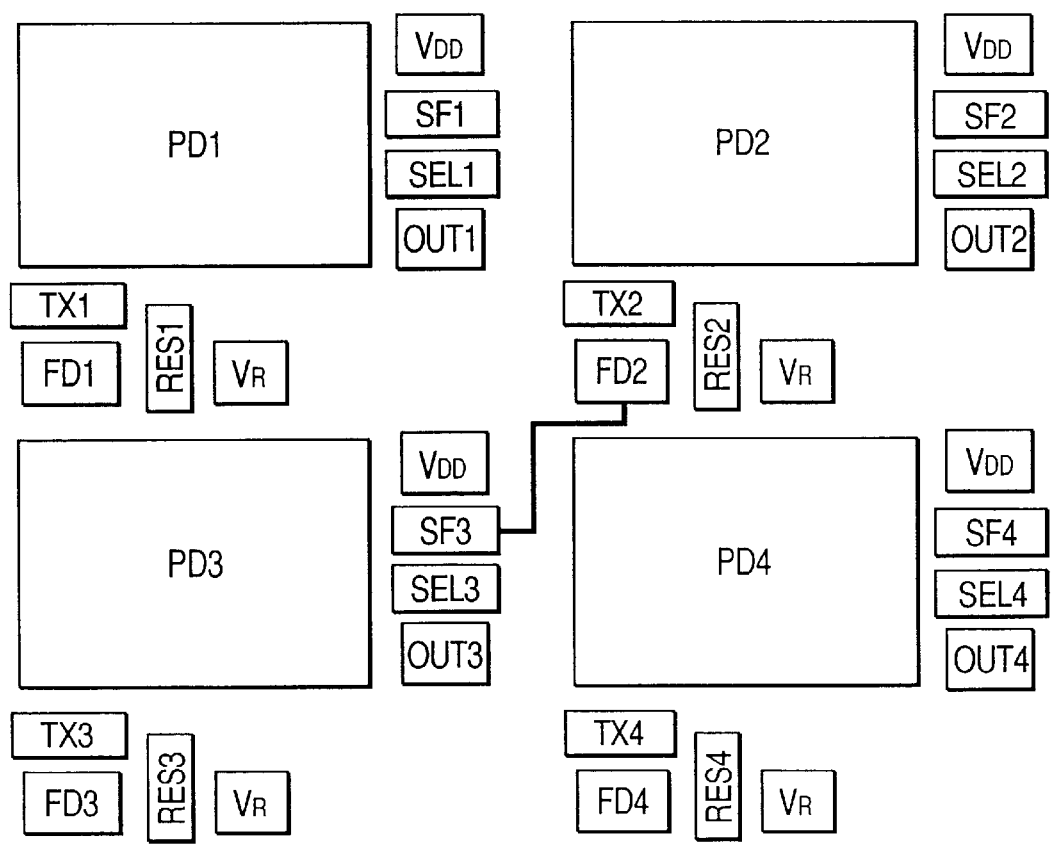
FIG. 16 is a view showing a schematic layout of a solid-state image pickup device according to the third embodiment.

FIG. 16 is a view showing a schematic layout of a solid-state image pickup device having the pixel arrangement shown in FIG. 15.

In the layout shown in FIG. 16, a VDD power source VDD and output portion OUT are reversed to those of the layout shown in FIG. 2. With this layout, the interconnection becomes shorter than that in connecting a floating diffusion FD2 and the gate of an amplifier means SF2, so the interconnection does not run above the gate of a reset switch RES2 and the gate of a selection switch SEL2.

Figure 17:
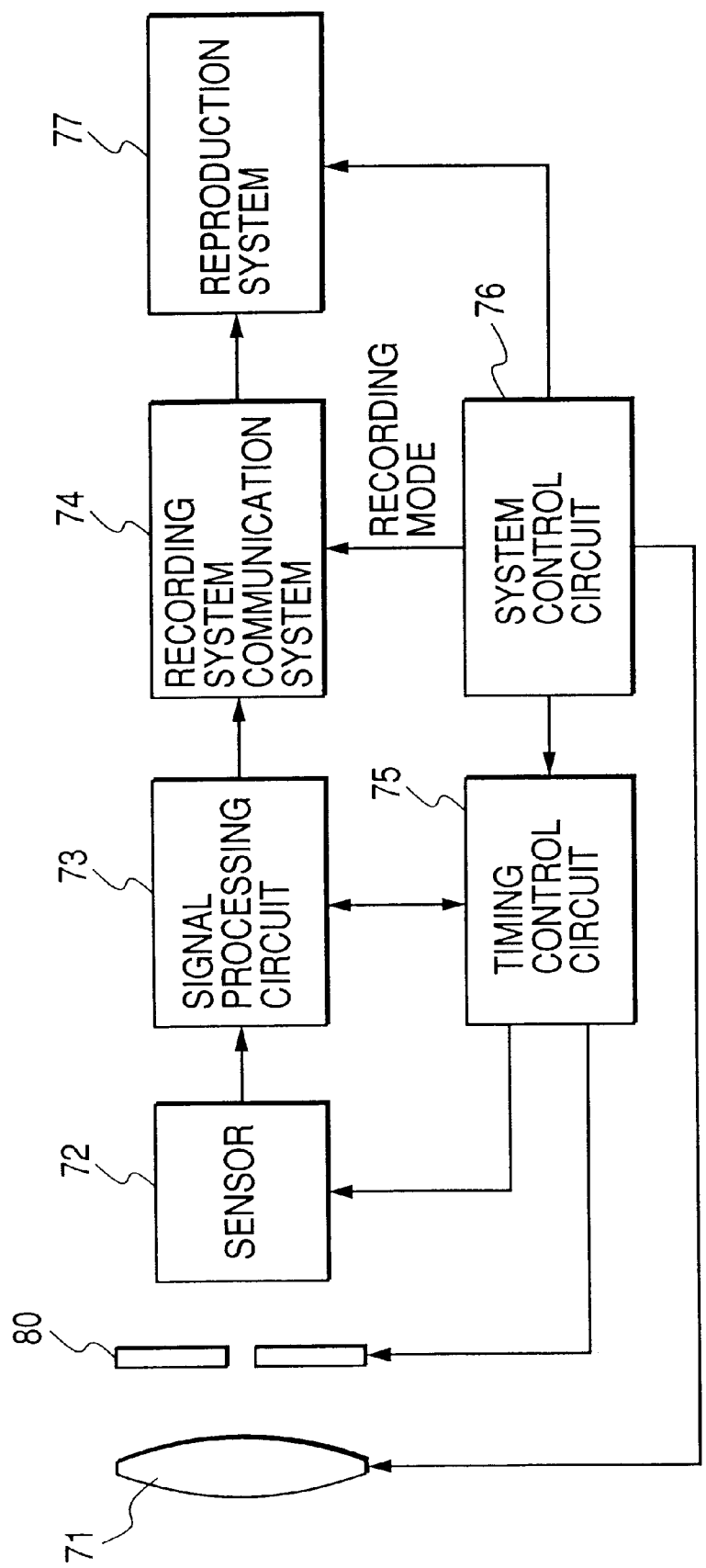
FIG. 17 is a view showing an image pickup system using one of the solid-state image pickup devices of the first to third embodiments.

FIG. 17 is a view schematically showing, as the fourth embodiment, a solid-image pickup system using one of the solid-state image pickup devices described in the first to third embodiments. As shown in FIG. 17, the image of light incident through an optical system 71 and an iris 80 is formed on a solid-state image pickup device 72. The light information is converted into an electrical signal by a pixel array on the solid-state image pickup device 72 and output. The output signal is converted by a signal processing circuit 73 on the basis of a predetermined scheme and output. The processed signal is recorded or transferred by an information recording device in a recording system/communication system 74. The recorded or transferred signal is reproduced by a reproducing system 77. The iris 80, solid-state image pickup device 72, and signal processing circuit 73 are controlled by a timing control circuit 75. The optical system 71, timing control circuit 75, recording system/communication system 74, and reproducing system 77 are controlled by a system control circuit 76.

As has been described above, according to the first to fourth embodiments, the interconnection between the floating diffusion (FD) and the amplifier means (SF) shortens, and the interconnection does not run above the gate of the reset means (RES) and the gate of the selection means (SEL). Since no crosstalk is generated from the signal φRES or φSEL, a solid-state image pickup device having a high fill factor and sensitivity and an image pickup system using the device can be obtained.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid-state image pickup apparatus comprising:

photoelectric conversion sections arranged in a plurality of lines;

a semiconductor area to which a signal from at least one of said photoelectric conversion sections is transferred;

a transfer electrode which transfers the signal from the photoelectric conversion section to said semiconductor area;

an amplification element which amplifies the signal in said semiconductor area to output the amplified signal to an output line;

a selection electrode provided in series with said amplification element, which selects said amplification element and reads out the signal from said selected amplification element;

a reset electrode which supplies a predetermined electric potential to said semiconductor area;

a transfer control line which sends a pulse to said transfer electrode; and a selection control line which sends a pulse to said selection electrode;

wherein said transfer control line and said selection control line are arranged between the photoelectric conversion sections of n-th and (n+1)-th lines, wherein n is an integer greater than one, wherein said transfer control line sends the pulse to said transfer electrode of a photoelectric conversion section of the n-th line, and wherein said selection control line sends the pulse to said selection electrode of a photoelectric conversion section of the (n+1)-th line.

2. An apparatus according to claim 1, wherein said transfer electrode is arranged between two of the photoelectric conversion sections arranged in a first direction, and wherein said amplification element and said selection electrode are arranged between two of the photoelectric conversion sections arranged in a second direction perpendicular to the first direction.

3. An apparatus according to claim 1, wherein said reset electrode is arranged in a first orientation relative to said semiconductor area, and wherein said amplification element and said selection electrode are arranged in a second orientation different than the first orientation.

4. An apparatus according to claim 3, wherein said reset electrode is arranged between the photoelectric conversion sections adjacent to each other in a first direction, and wherein said amplification element and said selection electrode are arranged between the photoelectric conversion sections adjacent to each other in a second direction perpendicular to the first direction.

5. An image pickup system comprising:

a solid-state image pickup apparatus of claim 1;

an optical system which focuses light onto said solid-state image pickup apparatus;

a signal processing circuit which processes a signal from said solid state image pickup apparatus; and a recording circuit which records the signal processed by said signal processing apparatus.

* * * * *

UNITED STATES PATENT AND TRADEMARK OFFICE
CERTIFICATE OF CORRECTION

PATENT NO. : 6,633,334 B1
DATED : October 14, 2003
INVENTOR(S) : Katsuhito Sakurai et al.

It is certified that error appears in the above-identified patent and that said Letters Patent is hereby corrected as shown below:

Title page,
Item [56], References Cited, OTHER PUBLICATIONS, "IEE Jouranl" should read -- IEEE Journal --.

Column 1,
Lines 53 and 54, "lowers" should read -- decreases --.

Column 3,
Line 26, "odification" should read -- modification --;
Line 27, "mage" should read -- image --; and
Line 53, "an" should read -- a --.

Column 4,
Line 38, "suffices" should read -- suffixes --.

Column 6,
Line 38, "Vr" should read -- VR --.

Signed and Sealed this

Twenty-third Day of March, 2004

JON W. DUDAS
*Acting Director of the United States Patent and Trademark Office*